(12) United States Patent
Meyer et al.

(10) Patent No.: US 11,372,027 B2
(45) Date of Patent: Jun. 28, 2022

(54) LOW-VOLTAGE POWER SWITCH AND ARC FAULT DETECTION UNIT WITH COMPENSATION DUE TO PHASE SHIFTING

(71) Applicant: Siemens Aktiengesellschaft, Munich (DE)

(72) Inventors: Joerg Meyer, Dresden (DE); Peter Schegner, Dresden (DE); Karsten Wenzlaff, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/276,854

(22) PCT Filed: Sep. 27, 2018

(86) PCT No.: PCT/EP2018/076271
§ 371 (c)(1),
(2) Date: Mar. 17, 2021

(87) PCT Pub. No.: WO2020/064110
PCT Pub. Date: Apr. 2, 2020

(65) Prior Publication Data
US 2022/0034942 A1    Feb. 3, 2022

(51) Int. Cl.
*G01R 15/18* (2006.01)
*H02H 1/00* (2006.01)

(52) U.S. Cl.
CPC ......... *G01R 15/181* (2013.01); *H02H 1/0015* (2013.01)

(58) Field of Classification Search
CPC .......... G01R 15/181; G01R 1/20; G01R 1/22; H02H 1/0015
(Continued)

(56) References Cited

U.S. PATENT DOCUMENTS 6,670,799 B1 * 12/2003 Bull ..................... G01R 15/246
324/96
2007/0182401 A1    8/2007 Driehorn et al.
(Continued)

FOREIGN PATENT DOCUMENTS

DE    102004011023 A1    9/2005
FR    3059783 A1    6/2018

*Primary Examiner* — Tung X Nguyen
*Assistant Examiner* — Robert P Alejnikov, Jr.
(74) *Attorney, Agent, or Firm* — Harness, Dickey & Pierce, P.L.C.

(57) ABSTRACT

A Rogowski coil is used for determining the magnitude of the electrical current of a conductor of a low-voltage AC circuit, which outputs an analogue voltage which is equivalent to the magnitude of the electrical current of the conductor. The Rogowski coil is connected to an analogue integrator, which is followed by an analogue-digital converter, which converts the integrated analogue voltage into a digital signal which is further processed by a microprocessor in such a way that the phase shift generated by the Rogowski coil and the components connected downstream of the Rogowski coil is compensated such that there are in-phase current values for the detection of error situations in order to protect the low-voltage AC circuit, in particular for a low-voltage power switch or an arc fault detection unit.

19 Claims, 5 Drawing Sheets

(58) Field of Classification Search
USPC .......................................................... 324/127
See application file for complete search history.

(56) References Cited

U.S. PATENT DOCUMENTS

| | | | |
|---|---|---|---|
| 2008/0136403 A1* | 6/2008 | Deck .................. | G01R 15/08 |
| | | | 324/110 |
| 2016/0178673 A1* | 6/2016 | Borgwardt ......... | G01R 19/2509 |
| | | | 324/120 |
| 2017/0138986 A1* | 5/2017 | Kern ................... | G01R 15/181 |

* cited by examiner

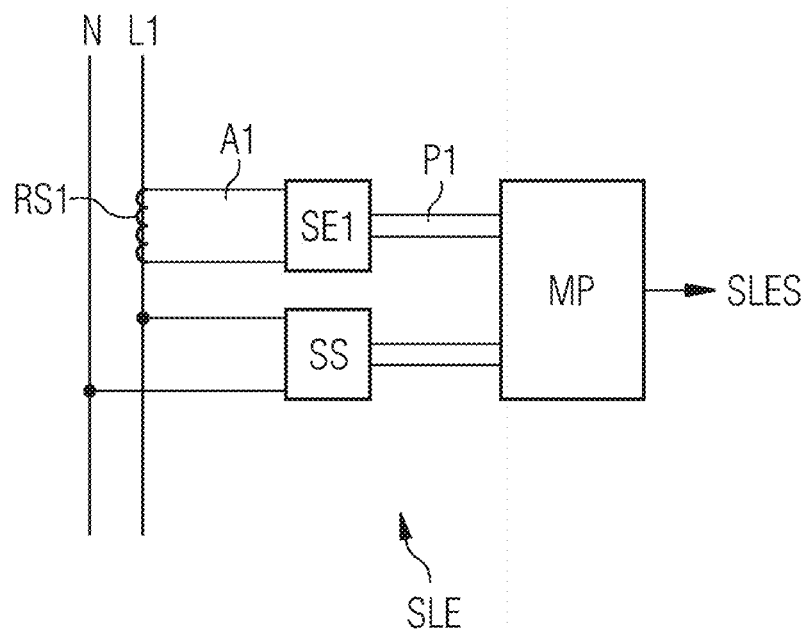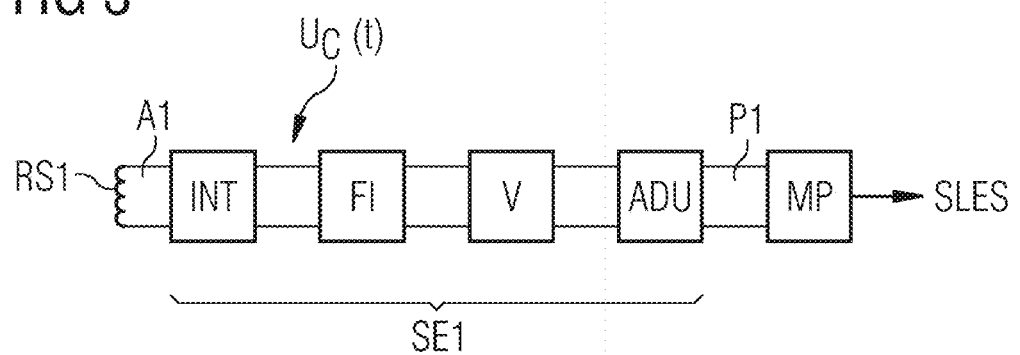

LOW-VOLTAGE POWER SWITCH AND ARC FAULT DETECTION UNIT WITH COMPENSATION DUE TO PHASE SHIFTING

PRIORITY STATEMENT

This application is the national phase under 35 U.S.C. § 371 of PCT International Application No. PCT/EP2018/076271, which has an International filing date of Sep. 27, 2018, which designated the United States of America, the entire contents of which are hereby incorporated herein by reference.

FIELD

The present application generally relates to a low-voltage power switch for a low-voltage AC circuit in accordance with the preamble to patent claim 1, an arc fault detection unit for a low-voltage AC circuit according to the preamble to patent claim 3, and a method for arc fault detection for a low-voltage AC circuit according to the preamble to patent claim 9.

BACKGROUND

Power switches are protective devices that function similarly to a fuse. Power switches monitor the current flowing through them by means of a conductor, and interrupt the electrical current or the flow of energy to an energy sink or to a consuming unit, a process known as tripping, when protection parameters such as current limit values or current-time-voltage limit values, i.e. when a current value is present for a certain period of time, are exceeded. The current limit values or the current-time-voltage limit values that have been set are corresponding tripping conditions. The interruption is, for example, achieved through contacts of the power switch that are opened.

For low-voltage circuits, installations and grids in particular there are various types of power switches, depending on the electrical current level provided in the electrical circuit. In the sense of the invention, power switch refers in particular to switches such as are employed in low-voltage installations for currents, in particular rated currents, or maximum currents of between 63 and 6300 amperes. In particular, closed power switches for currents between 63 and 1600 amperes, in particular of between 125 up to 630 or 1200 amperes are employed. Open power switches are in particular used for currents between 630 and 6300 amperes, in particular of between 1200 up to 6300 amperes.

Open power switches are also known as air circuit breakers, abbreviated to ACB, while closed power switches are known as molded case circuit breakers, abbreviated to MCCB, or compact power switches.

Low-voltage refers to voltages up to 1000 volts AC or 1500 volts DC. Low-voltage in particular refers to voltages greater than the low voltage having values of 50 volts AC or 120 volts DC.

In the sense of embodiments of the invention, power switch refers in particular to power switches with an electronic trip unit serving as a control unit, also referred to as an electronic trip unit, abbreviated to ETU.

In low-voltage AC circuits, low-voltage installations or low-voltage grids, short-circuits are usually accompanied by the occurrence of arc faults such as parallel or series arc faults. In high-power distribution and switching installations in particular, these arc faults can lead to disastrous damage to operating means, installation parts or entire switching installations if not switched off quickly enough. In order to avoid a longer-lasting, wide-area failure of the energy supply, and to reduce damage to both persons and generally, it is necessary to detect and extinguish arc faults of this sort, in particular high-current or parallel arc faults, within a few milliseconds. Conventional protection systems for energy supply installations cannot offer a reliable protection that meets the necessary temporal requirements.

Switching arcs such as occur during electrical switching, in particular at the contacts, are not intended here.

Arc faults refer to arcs such as occur in the presence of electrical faults in the circuit or in the installation. These can, for example, be caused by short-circuits or by poor connections.

If a current flows in a faulty phase conductor, for example with a reduced cross-section resulting, for example, from crushing, this, as a result of the reduced current carrying capacity, leads to an unacceptable degree of heating and, as a result of that, potentially to melting of the conductor and to a serial arc fault.

If a (near) short-circuit occurs to another phase conductor, this is referred to as a parallel arc fault.

Parallel arc faults can, for example, result from ageing of the insulation material or from the presence of conductive contamination between the phase conductors. They can occur between two different phase conductors, between a phase conductor (L) and the ground conductor (PE), or between phase conductors and the neutral line (N). In many cases, the parallel arc also arises as a result of a serial arc, caused for example by unprofessional working or incorrectly dimensioned means of contact.

If an arc has the properties of a parallel and of a serial arc fault, it is referred to as a combined arc fault.

In general, arc faults cause a conductive, faulty connection between conductors and installation parts.

Various possibilities for detecting arc faults have in the meantime become known. One possibility is that of detecting an arc fault from measured voltage and current values by evaluating characteristic properties. This is often done in that the voltage and current values are evaluated, or corresponding calculations are carried out, by means of a microprocessor. Voltage and current values including accurate phases must be available for many algorithms in order to detect an arc fault reliably or to avoid errors in the detection, so that interruptions to the low-voltage circuit, in spite of no arc faults being present, do not result.

The voltages are usually ascertained by means of voltage sensors which usually operate with accurate phase detection.

Measuring resistors, known as shunts, have until now been used for ascertaining the currents. The voltage across a known resistance is measured here, and the current ascertained from this. An ascertainment of the current level with an accurate phase is thereby provided. Measuring resistors have, however, the disadvantage that significant power losses, proportional to the current level, occur in them. In high-current low-voltage AC grids in particular, these cannot be neglected.

Rogowski coils, on the other hand, are available for ascertaining the current level. These deliver a voltage proportional to the differential of the current. The current level can be ascertained by integrating this voltage. Rogowski coils have the disadvantage that the ascertained current level is not accurate in phase. This is caused by the stray field inductance of the winding of the Rogowski coil. Rogowski coils have, on the other hand, the advantage that they exhibit potential isolation, the ability to withstand high currents, and low physical sizes. DE 102010011023 A1 discloses in this context a three-pole or four-pole low-voltage power switch with Rogowski coils acting as current sensors. FR 3059783 A1 further discloses a method for the manufacture of a measuring sensor for a power switch.

SUMMARY

At least one embodiment of the present invention enables the use of Rogowski coils for ascertaining current values with accurate phase, in particular for the detection of arc faults, in particular for a low-voltage power switch and an arc fault detection unit.

Embodiments are directed to a low-voltage power switch, an arc fault detection unit, or a method.

An arrangement is proposed according to at least one embodiment of the invention for a low-voltage AC circuit, in particular a low-voltage power switch or an arc fault detection unit, comprising:

at least one Rogowski coil for ascertaining the electrical current level of a conductor, in particular Rogowski coils for all the conductors of the low-voltage AC circuit, that outputs an analog voltage (P1) that is equivalent to the electrical current level of the conductor.

An analog method is further claimed according to at least one embodiment of the invention, in which the voltage values of at least one conductor of the low-voltage AC circuit are ascertained, in which current values of the at least one conductor of the low-voltage AC circuit are ascertained with a Rogowski coil, wherein the Rogowski coil outputs an analog voltage that is equivalent to the electrical current level of the conductor, the voltage values and current values are fed to a microprocessor that is configured in such a way that an arc fault recognition is carried out and an arc fault recognition signal is output when at least one limit value is exceeded.

BRIEF DESCRIPTION OF THE DRAWINGS

The properties, features and advantages of this invention described, as well as the manner in which this is achieved, will be understood with greater clarity and meaning in connection with the following description of the exemplary embodiments, which are explained in more detail in association with the drawings.

In the associated drawings:

FIG. 2 shows a block diagram of an arc fault detection unit;

FIG. 3 shows an arrangement according to an embodiment of the invention;

DETAILED DESCRIPTION OF THE EXAMPLE EMBODIMENTS

Figure 1:
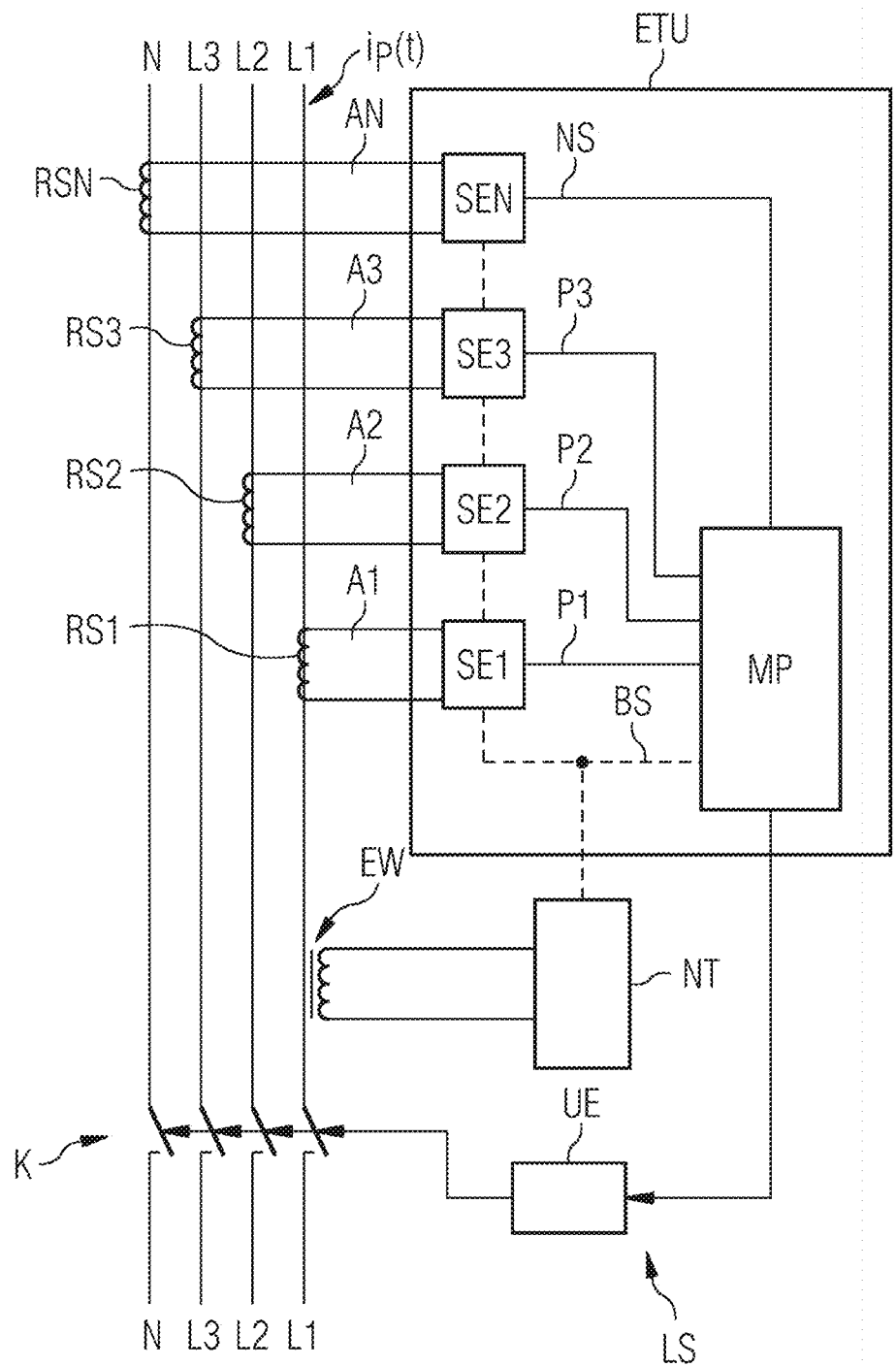
FIG. 1 shows a block diagram of a low-voltage power switch.

An arrangement is proposed according to at least one embodiment of the invention for a low-voltage AC circuit, in particular a low-voltage power switch or an arc fault detection unit, comprising:

at least one Rogowski coil for ascertaining the electrical current level of a conductor, in particular Rogowski coils for all the conductors of the low-voltage AC circuit, that outputs an analog voltage (P1) that is equivalent to the electrical current level of the conductor.

In an embodiment, the following are provided for a low-voltage power switch:

an interrupter unit with contacts for interrupting the low-voltage AC circuit, an electronic trip unit with a microprocessor connected to the at least one Rogowski coil and the interrupter unit, that is configured to initiate an interruption of the low-voltage AC circuit when current limit values and/or current-time-voltage limit values of the phase conductor are exceeded.

In an embodiment, the following are provided for an arc fault detection unit:

at least one voltage sensor ( ) for ascertaining the level of the voltage of the conductor (11), in particular voltage sensors for each conductor of the low-voltage AC circuit, with a microprocessor that carries out an arc fault detection using the ascertained current level and voltage level of the low-voltage AC circuit, and which outputs an arc fault detection signal when at least one limit value is exceeded.

The arrangement is designed, according to at least one embodiment of the invention, in such a way that the Rogowski coil (or each Rogowski coil) is/are (each) connected to an analog integrator, (each of) which is/are followed by an analog-digital converter (each of) which converts the integrated analog voltage (in each case) into a digital signal that is (are) processed by the microprocessor in such a way that the phase shift generated by the Rogowski coil and the components that follow the Rogowski coil, in particular the analog integrator, is compensated for, so that current values having accurate phase are ascertained that can be used for the recognition of fault situations to protect the low-voltage AC circuit, and in particular for fault arc recognition.

This has the particular advantage that Rogowski coils can be employed, with said advantages, in particular for the recognition of arc faults, wherein, as a result of the compensation of the phase shift, simple algorithms can also be used for fault arc recognition, or the algorithms here deliver reliable results, and incorrect interruptions of the low-voltage electrical circuit that is to be protected are avoided.

Advantageous embodiments of the invention are disclosed in the claims.

In one advantageous embodiment of the invention, an amplifier is provided between the Rogowski coil and the analog-digital converter. A differential amplifier can in particular be provided here, in order to provide an increase to the amplitude.

This has the particular advantage that, in addition to ascertaining current values with accurate phase, an adaptation in terms of amplitude, or the accuracy of the amplitude, can take place.

In one advantageous embodiment of the invention, the Rogowski coil, or the integrator, is followed by a filter, or a filter precedes the analog-digital converter.

This has the particular advantage that a filtering of the analog signal can take place in order to mask out interfering components, or to achieve a better frequency limitation of the signal that is to be converted from analog to digital.

In one advantageous embodiment of the invention, the Rogowski coil is characterized by a mutual inductance, a stray field inductance, and a winding resistance;

the analog integrator comprises at least one resistor/capacitor arrangement with a resultant capacitance and a resultant resistance.

This has the particular advantage that, in addition to the selection of the important variables of the Rogowski coil, a particularly simple realization of an analog integrator is available.

In one advantageous embodiment of the invention, current values with the correct phase are calculated from the digital signal by means of the mutual inductance, the stray field inductance, the resultant capacitance and the total of the winding resistance and the resultant resistance.

This has the particular advantage that an ascertainment of correct-phase current values is made possible with a few significant values, for example at least two values.

In one advantageous embodiment of the invention, the correct-phase digital current values of the current level of the conductor are calculated by means of the following formula:

$$i_P(t) = \int \frac{LC\frac{d^2 u_C(t)}{d^2 t} + RC\frac{du_C(t)}{dt} + u_C(t)}{M} dt + C\frac{du_C(t)}{dt}$$

This has the particular advantage that a specific calculation option for the accurate-phase or correct-phase current values is provided.

An analog method is further claimed according to at least one embodiment of the invention, in which the voltage values of at least one conductor of the low-voltage AC circuit are ascertained, in which current values of the at least one conductor of the low-voltage AC circuit are ascertained with a Rogowski coil, wherein the Rogowski coil outputs an analog voltage that is equivalent to the electrical current level of the conductor, the voltage values and current values are fed to a microprocessor that is configured in such a way that an arc fault recognition is carried out and an arc fault recognition signal is output when at least one limit value is exceeded.

According to an embodiment of the invention, the analog voltage is integrated and is processed in such a way that the phase shift generated by the Rogowski coil and the integrator, and possibly by other components, is compensated for in such a way that the correct-phase current values for the fault arc recognition are ascertained and used.

All the embodiments, both in independent and dependent form referred to in the claims, as well as referred merely to individual features or combinations of features of patent claims, bring about an improvement in the use of a Rogowski coil, in particular for the ascertainment of fault arcs.

FIG. 1 shows a schematic block diagram of a low-voltage power switch LS. FIG. 1 shows an electrical conductor L1, L2, L3, N of a low-voltage circuit, for example of a three-phase AC circuit, wherein the first conductor L1 forms the first phase with the first phase current $i_p(t)$, the second conductor L2 forms the second phase with the second phase current, the third conductor L3 forms the third phase with the third phase current, and the fourth conductor forms the neutral conductor N with the neutral conductor current of the three-phase AC circuit.

In the example according to FIG. 1, the first conductor L1 is connected to an energy converter EW (for example as part of a converter set) in such a way that at least part of the current, i.e. a partial conductor current, or the total current of the first conductor L1, flows through the primary side of the energy converter EW. Usually, one conductor, which in the example is the first conductor L1, forms the primary side of the energy converter EW. The energy converter EW is usually a transformer with a core, for example an iron-cored converter. In one embodiment, an energy converter EW can be provided in every phase, or in every conductor of the electrical circuit. The secondary side of the energy converter EW, or of each energy converter provided, is connected to a power supply unit NT (or a plurality of power supply units), which provides a supply of energy, for example a self-sufficient supply, for example in the form of a supply voltage, for the units of the low-voltage power switch, in particular for an electronic trip unit ETU, represented by a connection, drawn dashed, of operating voltage conductors BS. The power supply unit NT can also be connected to at least one or to all the current units SE1, SE2, SE3, SEN, to supply energy to the current units—if necessary.

Each current unit SE1, SE2, SE3, SEN is connected to a Rogowski coil RS1, RS2, RS3, RSN to ascertain the level of the electric current of the conductor of the electrical circuit assigned to it. In the example, the first current unit SE1 is assigned to the first conductor L1, i.e. the first phase; the second current unit SE2 is assigned to the second conductor L2, i.e. to the second phase; the third current unit SE3 is assigned to the third conductor L3, i.e. to the third phase; and the fourth current unit SEN is assigned to the (fourth conductor) neutral line N.

The Rogowski coils RS1, RS2, RS3, RSN supply an analog voltage A1, A2, A3, AN at their output that is proportional to the level of the conductor current. These are supplied to the first through fourth current units SE1, SE2, SE3, SEN. In the example, the first through fourth current units SE1, SE2, SE3, SEN are a part of the electronic trip unit ETU. They can, however, also be provided as separate units(s).

The current units SE1, SE2, SE3, SEN serve to process the voltage of the respective Rogowski coils. The current units SE1, SE2, SE3, SEN for example supply a digital signal P1, P2, P3, NS to a microprocessor MP that is, for example, provided in the electronic trigger unit ETU.

The transmitted digital signals P1, P2, P3, NS are compared with current limit values and/or current-time-voltage limit values that form tripping conditions in the electronic trip unit ETU. An interruption of the electrical circuit is initiated when these are exceeded. An overcurrent and/or short-circuit protection is hereby realized. This can, for example, be done in such a way that an interrupter unit UE is provided which is connected on the one hand to the electronic trip unit ETU and on the other hand has contacts K for interrupting the conductors L1, L2, L3, N or further conductors. In this case, the interrupter unit UE receives an interruption signal for opening the contacts K.

FIG. 2 shows an arrangement for fault arc detection with a fault arc detection unit SLE, in which the same units are provided as in FIG. 1. This comprises at least one Rogowski coil RS1 for ascertaining the electrical current level of a conductor L1 of the low-voltage AC circuit, and output an analog voltage A1 that is equivalent to the electrical current level of the conductor L1. The Rogowski coil RS1 is connected to a current unit SE1.

It further comprises at least one voltage sensor SS for ascertaining the level of the voltage of the conductor L1 or of the conductor of the low-voltage AC circuit.

It further comprises a microprocessor MP that is connected to the current unit SE1 and the voltage sensor SS, wherein the ascertained current level and voltage level of the low-voltage AC circuit are used for arc fault detection by the microprocessor. If at least one or a plurality of limit values/fault arc limit values is exceeded, a fault arc recognition signal SLES is output. The fault arc recognition can take place in accordance with known methods, for example a signal progression analysis of the voltage and/or of the current, a differential or integrating solution etc.

Only one circuit with two conductors is shown in the example according to FIG. 2. A three-phase AC current with or without a neutral line can be provided in a similar way.

FIG. 3 shows a design of a current unit SE1 according to FIG. 2 or FIG. 1. This comprises an analog integrator INT, connected to the Rogowski coil RS1. The analog voltage A1 of the Rogowski coil is supplied to this. Analog integrator refers here to an integrator that carries out an integration using discrete components such as capacitors, inductors, resistors etc. in accordance with analog circuit technology. An analog signal is, in other words, integrated.

An integration using digitized signals and digital circuit technology, for example using a microprocessor, is not intended.

The analog integrator INT supplies an integrated analog voltage $u_c(t)$. In one variant this is subjected directly to analog-digital conversion, for example using an analog-digital converter ADU that outputs a digital signal P1 to the microprocessor MP.

In various embodiments according to the invention, a filter FI and/or an amplifier V can be provided in any desired sequence between the analog integrator INT and the analog-digital converter ADU, for example according to FIG. 3. Alternatively, a filter can also be provided before the integrator INT.

The microprocessor MP is designed in such a way that the phase shift generated by the Rogowski coil RS1 and by the components that follow the Rogowski coil, in particular the integrator INT, possibly the filter FI and/or the amplifier V, is compensated for, so that correct-phase current values ip(t) are ascertained and used for the arc fault recognition.

The current unit SE1, or the arrangement/configuration according to FIG. 3, can be a part of the low-voltage power switch according to FIG. 1.

Figure 4:
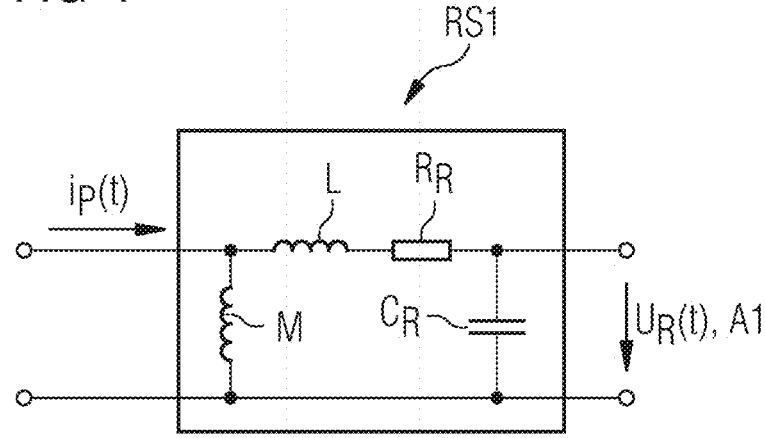
FIG. 4 shows an equivalent circuit diagram of a Rogowski coil.

FIG. 4 shows an equivalent circuit diagram of a Rogowski coil RS1. A current $i_p(t)$ of the associated conductor hereby brings about an analog voltage $u_r(t)$ of the Rogowski coil, which corresponds to the analog voltage A1. A mutual inductance M is entered on the equivalent circuit diagram between the two terminals of the Rogowski coil; this corresponds to the magnetic coupling. On the basis of this mutual inductance M, a voltage $u_r(t)$ or A1 that is proportional to the changing current in the conductor is output at the output of the Rogowski coil.

$$u_M = M_R \frac{di_M}{dt}$$

The stray field inductance L, positioned in series in the equivalent circuit diagram according to FIG. 4, results in a phase shift of the output voltage. The winding resistance RR, positioned in series, results in a change in the amplitude. A winding capacitance CR is furthermore present, but can be neglected for a practical consideration as a result of its low magnitude.

As a result of the reactance and resistance located in series according to the simplified equivalent circuit diagram of the Rogowski coil, a phase shift results between the primary current in the conductor and the output voltage $u_r(t)$ or A1 at the Rogowski coil.

Figure 5:
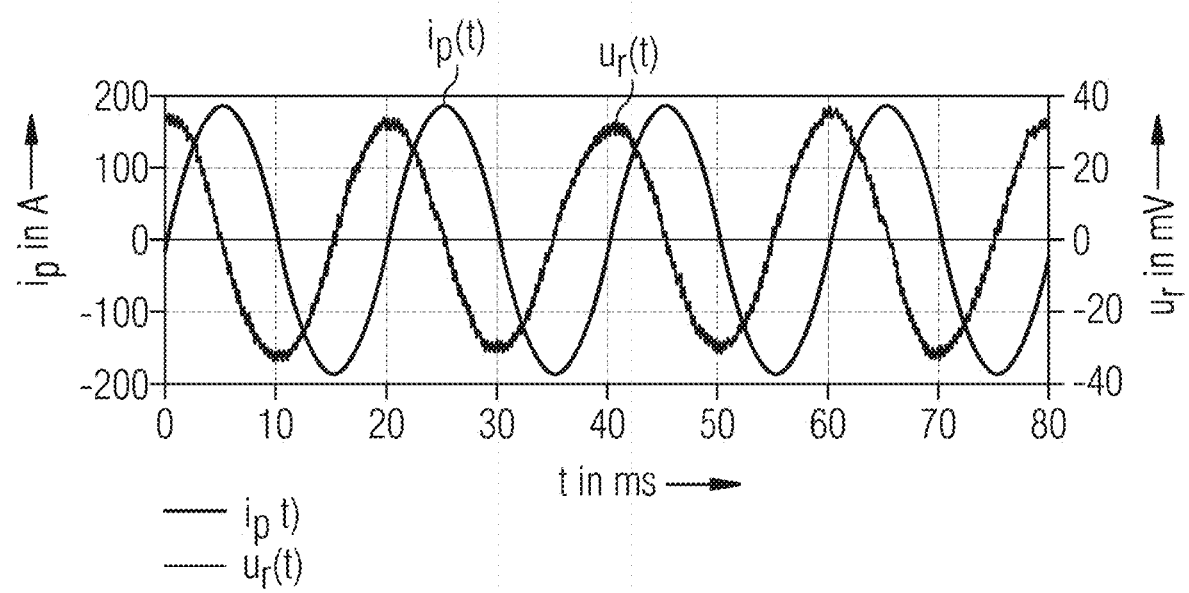
FIG. 5 shows a first diagram with a voltage curve and a current curve.

FIG. 5 shows a curve that exemplifies this. FIG. 5 shows a first diagram with a voltage curve $u_r$ or $u_r(t)$, scaled in millivolts, of the output voltage of the Rogowski coil, and a current curve $i_p$ or $i_p(t)$, drawn in amperes, of the current of the conductor against time t in milliseconds, which is plotted on the horizontal axis.

The phase shift between the current and voltage can be seen clearly.

Figure 6:
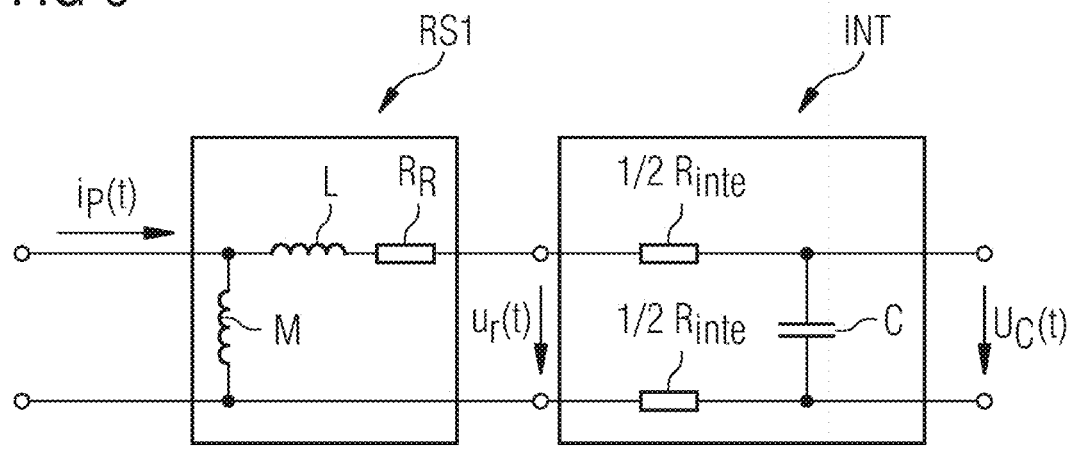
FIG. 6 shows an equivalent circuit diagram of a Rogowski coil and an integrator.

FIG. 6 shows an arrangement according to FIG. 4, with the difference that an integrator INT is connected at the output of the Rogowski coil RS1, consisting in the example of an RC network, wherein a resultant capacitance C, for example in the form of one or a plurality of capacitors, is connected between the two conductors, and an integrator resistor ($R_{inte}$) is connected in series with at least one conductor or both conductors.

The integrated analog output voltage $u_c(t)$ is output here at the integrator INT.

Figure 7:
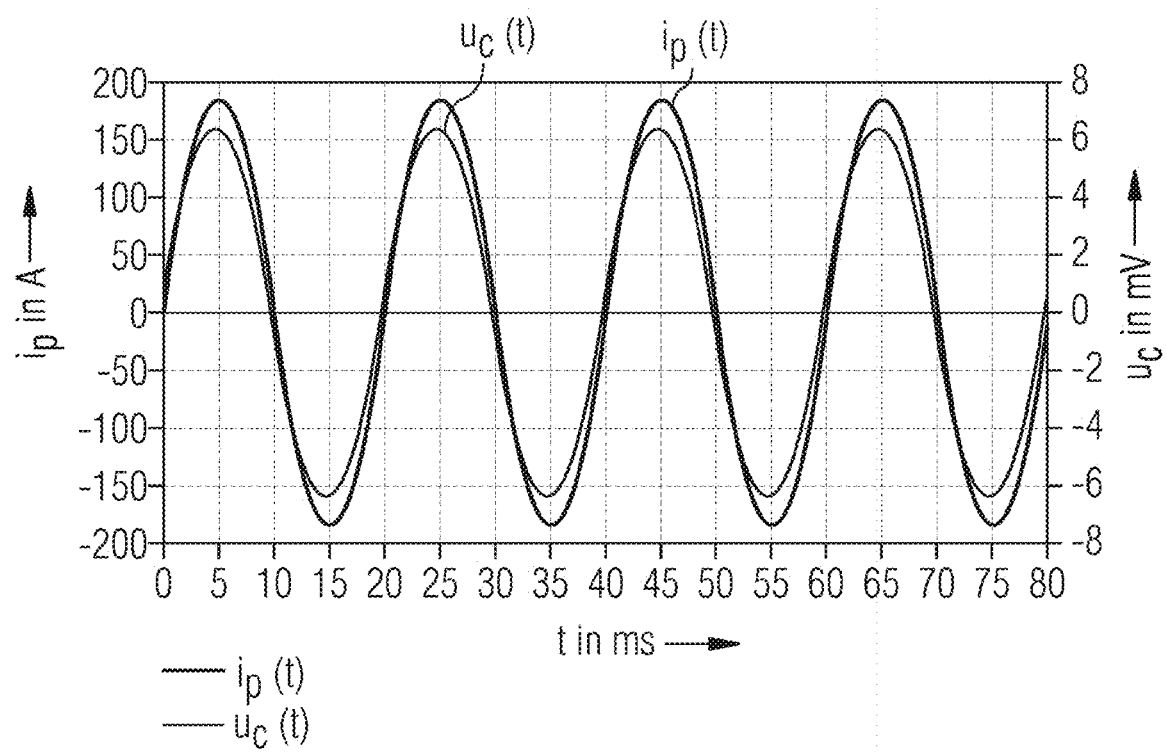
FIG. 7 shows a second diagram with a voltage curve and a current curve.

FIG. 7 shows a second diagram with a voltage and current curve according to FIG. 5, with the difference that instead of the voltage $u_r(t)$ or A1 of the Rogowski coil RS1, the integrated analog voltage $u_c$ or $u_c(t)$ is plotted in millivolts against time t in milliseconds.

The phase shift is partially, although not completely, compensated for by the analog integration, as can be seen in FIG. 7.

This is frequently not sufficient for the recognition of fault arcs.

Figure 8:
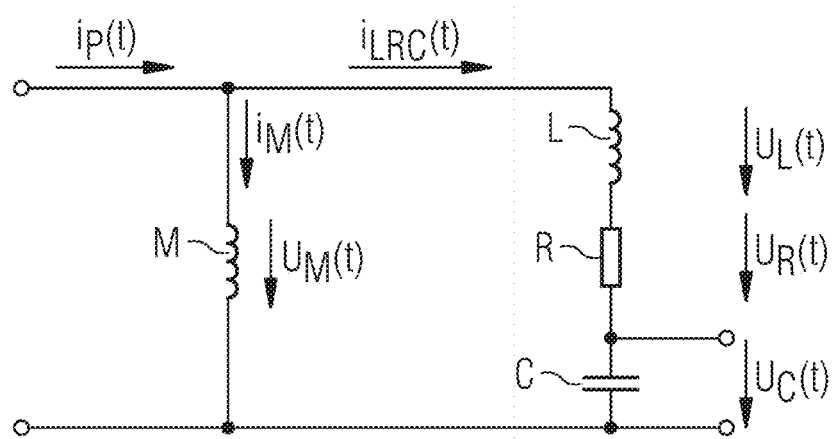
FIG. 8 shows an equivalent circuit diagram with summarized components.

FIG. 8 shows an equivalent circuit diagram according to FIG. 6 with summarized components. The winding resistor RR of the Rogowski coil and the integrator resistance $R_{inte}$ are combined here into a resultant resistance R, wherein the resultant resistance R is the sum of the winding resistance $R_{inte}$, $R=RR+R_{inte}$.

Figure 9:
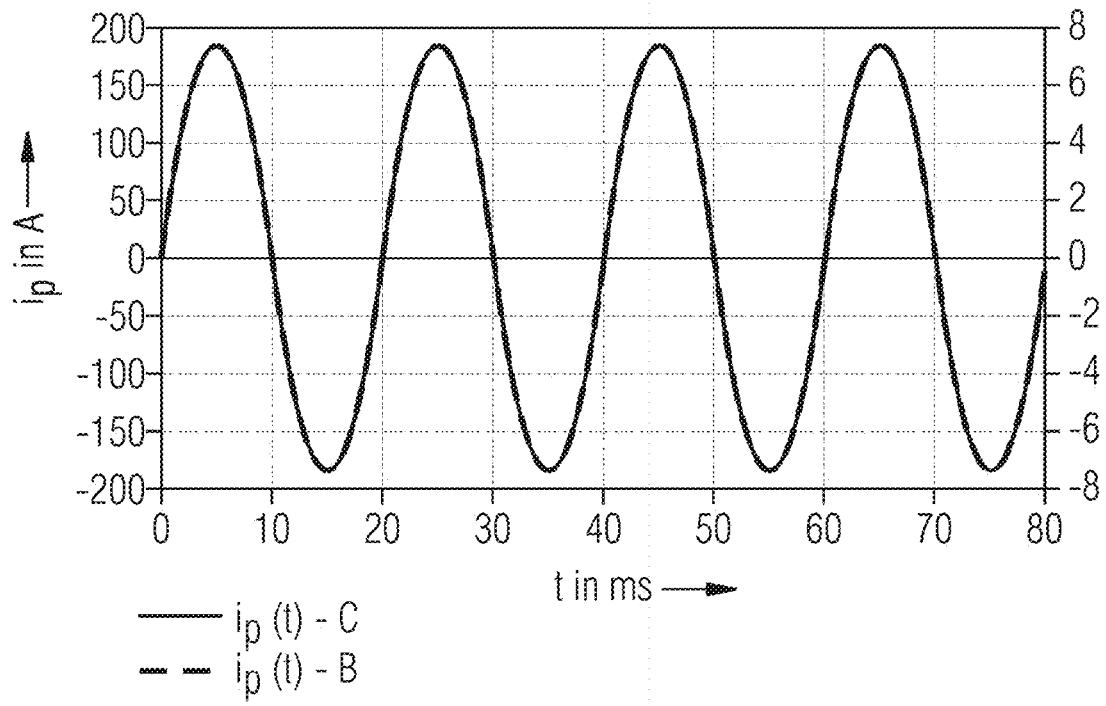
FIG. 9 shows a third diagram with a first and a second current curve.

FIG. 9 shows a third diagram with a first and a second current curve according to FIG. 5, with the difference that instead of the integrated analog voltage $u_c$ or $u_c(t)$, the calculated current $i_p$ or $i_p(t)$–B is plotted against the time t in milliseconds in comparison with the measured current $i_p$ or $i_p(t)$–G.

As can be seen, as a result of the calculation according to the invention using an analog-digital converter ADU and a microprocessor MP, possibly making use of a filter FI and/or an amplifier V and taking them into account in the calculation, the phase shift between the measured and calculated current has been almost completely compensated for. Correct-phase current values are thus present, and can in particular be used for the fault arc recognition as well as for the recognition of other fault situations for protection of the low-voltage AC circuit.

In relation to a parallel voltage measurement that exhibits no phase delay, accurate-phase or correct-phase current values are thus present, wherein these correct-phase voltage and current values can advantageously be used for fault arc detection or for the detection of other fault situations for protection of the low-voltage AC circuit.

In particular for the protection of high-current switching and distribution installations, numerical algorithms can in future also be used for low voltages. The use of, for example, distance protection algorithms makes it necessary for there to be no phase shift between the sampled current and voltage measured values. The application of measuring resistors (shunts) is thus suitable for the current measurement. At the outputs these develop, according to Ohm's law, a voltage proportional to the current, and this can be acquired with a voltage measuring device. The current can be determined by means of a back-calculation. The use of magnetic transducers, of Rogowski coils for example, for current measurement leads to a shift in the phase of the measured current, but nevertheless has significant advantages in terms of the potential isolation and of the low physical size in comparison with shunts.

The output signal has to be integrated to calculate the current, since the measured voltage is only proportional to the current change. Two methods, on the one hand a numerical integration and an analog integration on the other hand, can be used for this purpose. Numerical integrations have problems with large changes in current: the resolution of a downstream analog-digital converter or A/D converter is limited. A large change in the current (e.g. on the occurrence of a short-circuit) leads to very high voltage values that an analog-digital converter may not be able to resolve. This effect is known as clipping, and leads to incorrect results.

An analog integrator circuit is therefore employed according to the invention, which can consist, for example, of an R-C network. An equivalent circuit diagram according to FIG. 6 results in connection with the Rogowski coil, wherein the winding capacitance of the Rogowski coil was neglected.

The phase shift is only partially compensated for by the integrator. The phase difference is illustrated in FIG. 7. As a result of the phase difference, an error occurs in the calculated result when distance protection algorithms are applied. The use of Rogowski coils has therefore been rejected in the past.

Now, according to an embodiment of the invention, the current in the conductor, or the primary current, is determined through back-calculating from the transmission characteristic of the Rogowski coil and of the integrator, with correct phase (and correct amplitude, if necessary). In the presence of further components that influence the phase (and/or influence the amplitude), these are or can also be calculated out according to an embodiment of the invention. A mesh equation is set up for this purpose according to the equivalent circuit diagram according to FIG. 6 or 8, and solved. On this basis, the correct-phase and correct-amplitude primary current of the Rogowski coil can be determined from the voltage of the Rogowski coil or the voltage of the integrator.

Due to the correct-phase and correct-amplitude determination of the primary current, it is possible with the invention to compensate numerically for the transmission characteristic of Rogowski coils. Rogowski coils can thus in future find application in protection devices such as low-voltage power switches or fault arc detection units for the detection of challenging fault situations.

The electrical elements can be summarized according to the simplified equivalent circuit diagram of the Rogowski coil with integrator according to FIG. 6. An equivalent circuit diagram according to FIG. 8 thus results.

By solving the mesh equation $$u_M(t) = u_L(t) + u_R(t) + u_C(t) \tag{1}$$

the voltage $u_m(t)$ across the mutual inductance M can be determined, and thus, following a numerical integration, for example in the microprocessor MP, the primary current $i_p$ can be calculated. The voltage $u_c(t)$ is the value measured over the capacitance C of the integrator INT. The secondary-side current $i_{LRC}(t)$ is calculated in the first step to calculate the individual voltages:

$$i_{LRC}(t) = C\frac{du_C(t)}{dt} \tag{2}$$

The voltage across the combined resistance of the Rogowski coil and the integrator can thus be calculated according to the following formula:

$$u_R(t) = RC\frac{du_C(t)}{dt} \tag{3}$$

The voltage over an inductance is generally calculated according to $$u(t) = L\frac{di(t)}{dt} \tag{4}$$

In accordance with the equivalent circuit diagram according to FIG. 8, the current $i_{LRC}$ is used for the calculation of the voltage $u_L$ across the inductance.

$$u_L(t) = L\frac{di_{LRC}(t)}{dt} \tag{5}$$

$u_L$ can be calculated directly from the measured voltage $u_c$ by inserting equation 2 into equation 5:

$$u_L(t) = LC\frac{d^2u_C(t)}{d^2t} \tag{6}$$

By inserting equations 3 and 5 into equation 1, the voltage $u_M(t)$ across the mutual inductance of the Rogowski coil is calculated:

$$u_M(t) = LC\frac{d^2u_C(t)}{d^2t} + RC\frac{du_C(t)}{dt} + u_C(t) \tag{7}$$

The integration of the current change is used to ascertain the primary current as follows, taking the mutual inductance M and the node equations into account:

$$i_P(t) = \int \frac{LC\frac{d^2u_C(t)}{d^2t} + RC\frac{du_C(t)}{dt} + u_C(t)}{M}dt + C\frac{du_C(t)}{dt} \tag{7}$$

If a calculation is applied in accordance with this, a (quasi-) corresponding calculated, correct-phase current value $i_p(t)$–B is found in comparison to a measured current value $i_p(t)$–G, according to FIG. 9.

In practice, giving consideration to the secondary-side current of the Rogowski coil can be omitted for a sufficiently accurate calculation.

If the integrator INT at the Rogowski coil is supplemented by one or a plurality of filters or filter circuits FI, then these elements are advantageously taken into account in accordance with an equivalent circuit diagram in the transmission characteristic. On the basis of the approach to a solution illustrated, with a mesh equation having been set up, the transmission characteristic can be determined and the primary current can thus be calculated.

An embodiment of the invention has the advantage that the classic current converter (large physical size) can be replaced by compact, lightweight Rogowski coils.

Although the invention has been closely illustrated and described in detail through the exemplary embodiment, the invention is not restricted by the disclosed examples, and other variations can be derived from this by the expert without leaving the scope of protection of the invention.

The invention claimed is:

1. A low-voltage power switch for a low-voltage AC circuit, comprising:
   a Rogowski coil, for ascertaining an electrical current level of a conductor of the low-voltage AC circuit, to output an analog voltage equivalent to the electrical current level of the conductor;
   an interrupter unit including contacts for interrupting the low-voltage AC circuit; and
   an electronic trip unit including a microprocessor connected to the Rogowski coil and the interrupter unit, the electronic trip unit configured to initiate an interruption of the low-voltage AC circuit upon at least one of current limit values or current-time-voltage limit values of a phase conductor being exceeded, the Rogowski coil being connected to an analog integrator followed by an analog-digital converter, to convert an integrated analog voltage into a digital signal, wherein
   the microprocessor is configured to process the digital signal to compensate for a phase shift generated by the Rogowski coil and by components that follow the Rogowski coil, so that correct-phase current values are present for recognition of a fault situation to protect the low-voltage AC circuit.

2. The low-voltage power switch of claim 1, wherein the recognition of the fault situation is a fault arc recognition ascertained with the correct-phase current values.

3. The low-voltage power switch of claim 1, further comprising:
   an amplifier between the Rogowski coil and the analog-digital converter.

4. The low-voltage power switch of claim 1, further comprising:
   a filter following the Rogowski coil or the analog integrator, or preceding the analog-digital converter.

5. The low-voltage power switch of claim 1, wherein the Rogowski coil includes a mutual inductance, a stray field inductance and a winding resistance, and wherein the analog integrator includes at least one resistor/capacitor arrangement with a resultant capacitance and an integrator resistance.

6. The low-voltage power switch of claim 5, wherein the correct-phase current values are calculated from the digital signal via the mutual inductance, the stray field inductance, the resultant capacitance and a sum of the winding resistance and the integrator resistance, forming a resultant resistance.

7. The low-voltage power switch of claim 6, wherein the correct-phase current values are calculated by integrating over time (dt) in accordance with:

$$i_P(t) = \int \frac{LC\frac{d^2 u_C(t)}{d^2 t} + RC\frac{du_C(t)}{dt} + u_C(t)}{M} dt + C\frac{du_C(t)}{dt}.$$

8. An arc fault detection unit for a low-voltage AC circuit, comprising:
   at least one Rogowski coil for ascertaining an electrical current level of a conductor of the low-voltage AC circuit, to output an analog voltage equivalent to the electrical current level of the conductor;
   at least one voltage sensor for ascertaining a level of a voltage of the conductor of the low-voltage AC circuit; and
   a microprocessor to carry out a fault arc detection with the electrical current level ascertained and the level of the voltage ascertained and, upon at least one limit value being exceeded by at least one of the electrical current level ascertained or the level of the voltage ascertained, to output a fault arc recognition signal, wherein
   the at least one Rogowski coil is connected to an analog integrator, followed by an analog-digital converter, to convert an integrated analog voltage into a digital signal to be further processed by the microprocessor, and
   a phase shift generated by the at least one Rogowski coil and by components following the at least one Rogowski coil are compensated for by the microprocessor, to ascertain correct-phase current values for the arc fault recognition.

9. The arc fault detection unit of claim 8, further comprising:
   an amplifier between the at least one Rogowski coil and the analog-digital converter.

10. The arc fault detection unit of claim 8, further comprising:
    a filter following the at least one Rogowski coil or the analog integrator, or preceding the analog-digital converter.

11. The arc fault detection unit of claim 8, wherein the at least one Rogowski coil includes a mutual inductance, a stray field inductance and a winding resistance, and wherein the analog integrator includes at least one resistor/capacitor arrangement with a resultant capacitance and an integrator resistance.

12. The arc fault detection unit of claim 11, wherein the correct-phase current values are calculated from the digital signal via the mutual inductance, the stray field inductance, the resultant capacitance and a sum of the winding resistance and the integrator resistance, forming a resultant resistance.

13. The arc fault detection unit of claim 12, wherein the correct-phase current values are calculated by integrating over time (dt) in accordance with:

$$i_P(t) = \int \frac{LC\frac{d^2 u_C(t)}{d^2 t} + RC\frac{du_C(t)}{dt} + u_C(t)}{M} dt + C\frac{du_C(t)}{dt}.$$

14. A method for fault arc recognition for a low-voltage AC circuit, comprising:

ascertaining voltage values of at least one conductor of the low-voltage AC circuit;

ascertaining current values of the at least one conductor of the low-voltage AC circuit with a Rogowski coil, the Rogowski coil being configured to output an analog voltage equivalent to an electrical current level of the at least one conductor;

supplying the voltage values ascertained and current values ascertained to a microprocessor, the microprocessor being configured to carry out an arc fault recognition and, upon at least one limit value being exceeded by at least one of the voltage values ascertained or the current values ascertained, to output an arc fault recognition signal, the analog voltage being integrated and processed further such that a phase shift generated by the Rogowski coil and the integrating is compensated for in such a way that correct-phase current values for the fault arc recognition are ascertained and used.

15. The method of claim 14, wherein the analog voltage or integrated analog voltage is filtered or amplified.

16. The method of claim 15, wherein compensation of the phase shift is configured to be carried out in the microprocessor, the microprocessor being configured to calculate the correct-phase current values through numerical back-calculation via mutual inductance, stray field inductance, a resultant capacitance and a sum of a winding resistance and a resultant resistance.

17. The method of claim 16, wherein physical magnitudes of further components are taken into consideration in the numerical back-calculation.

18. The method of claim 14, wherein compensation of the phase shift is configured to be carried out in the microprocessor, the microprocessor being configured to calculate the correct-phase current values through numerical back-calculation via mutual inductance, stray field inductance, a resultant capacitance and a sum of a winding resistance and a resultant resistance.

19. The method of claim 18, wherein physical magnitudes of further components are taken into consideration in the numerical back-calculation.

* * * * *